United States Patent
Albrecht

(10) Patent No.: US 9,341,688 B2
(45) Date of Patent: May 17, 2016

(54) MRT SYSTEM WITH A MAGNETIC COIL AND METHOD FOR MANUFACTURING A CIRCUIT ARRANGEMENT FOR SWITCHING A COIL CURRENT

(71) Applicant: Adam Albrecht, Nuremberg (DE)

(72) Inventor: Adam Albrecht, Nuremberg (DE)

(73) Assignee: Siemens Aktiengesellschaft, München (DE)

( * ) Notice: Subject to any disclaimer, the term of this patent is extended or adjusted under 35 U.S.C. 154(b) by 747 days.

(21) Appl. No.: 13/675,945

(22) Filed: Nov. 13, 2012

(65) Prior Publication Data

US 2013/0119989 A1    May 16, 2013

(30) Foreign Application Priority Data

Nov. 14, 2011  (DE) .......................... 10 2011 086 314

(51) Int. Cl.
| | | |
|---|---|---|
| *G01V 3/00* | (2006.01) | |
| *G01R 33/341* | (2006.01) | |
| *G01R 3/00* | (2006.01) | |
| *G01R 33/36* | (2006.01) | |
| *G01R 33/385* | (2006.01) | |

(52) U.S. Cl.
CPC ................ *G01R 33/341* (2013.01); *G01R 3/00* (2013.01); *G01R 33/3607* (2013.01); *G01R 33/3614* (2013.01); *G01R 33/3852* (2013.01); *Y10T 29/49117* (2015.01)

(58) Field of Classification Search
CPC .................................................. G01R 33/341
USPC ....................................................... 324/322
See application file for complete search history.

(56) References Cited

U.S. PATENT DOCUMENTS

| | | | |
|---|---|---|---|
| 5,420,537 A | 12/1971 | Jones | |
| 5,113,145 A | 5/1992 | Ideler | |
| 5,721,490 A * | 2/1998 | Takano et al. | 324/322 |
| 6,323,649 B1 * | 11/2001 | Pace et al. | 324/322 |
| 7,821,336 B2 * | 10/2010 | Albrecht et al. | 330/127 |
| 8,324,900 B2 * | 12/2012 | Helvoort et al. | 324/322 |
| 2005/0024056 A1 * | 2/2005 | Sabate et al. | 324/322 |
| 2005/0116714 A1 * | 6/2005 | Rudakov et al. | 324/322 |
| 2005/0242816 A1 * | 11/2005 | Kurpad et al. | 324/322 |
| 2006/0033499 A1 * | 2/2006 | Flexman et al. | 324/322 |
| 2009/0102484 A1 * | 4/2009 | DeVries et al. | 324/322 |
| 2011/0241686 A1 | 10/2011 | Pradeep | |
| 2015/0054509 A1 * | 2/2015 | Smits et al. | 324/322 |

FOREIGN PATENT DOCUMENTS

| | | |
|---|---|---|
| DE | 4007566 A1 | 9/1991 |
| DE | 693 28 834 T2 | 10/2000 |

OTHER PUBLICATIONS

German Office Action dated Aug. 10, 2012 for corresponding German Patent Application No. DE 10 2011 086 314.1 with English translation.

* cited by examiner

*Primary Examiner* — Rodney Fuller
(74) *Attorney, Agent, or Firm* — Lempia Summerfield Katz LLC

(57) ABSTRACT

In a magnetic resonance tomography (MRT) system, a current strength of a coil current is controllable by a plurality of semiconductor power switches as a function of a control signal. The plurality of semiconductor power switches receive the control signal at respective control inputs from a control line. In each of at least two semiconductor power switches of the plurality of semiconductor power switches, a compensation resistance element is connected between the control input and the control line. Resistance values of the compensation resistance elements are different.

18 Claims, 2 Drawing Sheets

MRT SYSTEM WITH A MAGNETIC COIL AND METHOD FOR MANUFACTURING A CIRCUIT ARRANGEMENT FOR SWITCHING A COIL CURRENT

This application claims the benefit of DE 10 2011 086 314.1, filed on Nov. 14, 2011, which is hereby incorporated by reference.

BACKGROUND

The present embodiments relate to a magnetic resonance tomography (MRT) system that has at least one magnetic coil for creating a magnetic resonance coupled to a circuit arrangement with a plurality of semiconductor power switches that control the current strength of the coil current.

In an MRT system, the magnetic field, through which a magnetic resonance is created in a body to be examined, is generated by a number of magnetic coils. A constant magnetic basic field or $B_0$ field is overlaid with a number of further magnetic fields that, depending on a measurement procedure or sequence carried out, are modifiable in field strength or alignment. Examples for these fields are the gradient fields and the high-frequency alternating field of the body coil. The magnetic coils for generating these adjustable fields may, for example, consume over 10 KW or even over 40 KW of electrical power. In order to be able to switch the coil current used for this quickly enough, semiconductor power switches, such as transistors, are used as switching elements for controlling the current strength of the coil current. In the event of a single power switch alone not being able to conduct the coil current to be switched without becoming thermally overloaded in doing so, an individual magnetic coil may be supplied by a plurality of semiconductor power switches. Each semiconductor power switch of the plurality of semiconductor power switches then switches a part current, respectively, of the overall coil current to be provided. The semiconductor power switches connected in parallel may thus be switched by a control signal of a control module of the MRT system.

Because of the high-frequency alternating fields, with MRT systems, controlling circuit devices such as the control module, for example, and the control lines leading to semiconductor power switches are to be shielded against the magnetic and electromagnetic fields. Otherwise, interference voltages may be induced in the circuit arrangements, and the functional integrity of the MRT system may be adversely affected by this.

SUMMARY AND DESCRIPTION

The present embodiments may obviate one or more of the drawbacks or limitations in the related art. For example, a reliable yet still efficient operation of a magnetic resonance tomography (MRT) system is provided.

With one embodiment of the MRT system, a coil current may be controlled using a plurality of semiconductor power switches as a function of a control signal. In such cases, the semiconductor power switches receive the control signal at a respective control input from a control line. The control input may, in the case of a transistor such as a metal oxide semiconductor field-effect transistor (MOSFET), for example, include a gate. With at least two of the semiconductor power switches, in the case of the MRT system, a compensation resistance element is connected in each case between the control input and the control line. Such a compensation resistance element may, for example, include an individual electrical component such as an ohmic resistor, for example, as well as a circuit including a number of components. In addition to ohmic resistors, a compensation resistance element may also include other components such as coils, capacitors or semiconductor components. With the compensation resistance elements, at least two of the compensation resistance element may have different resistance values.

One embodiment of the MRT system has the advantage that, by suitable choice of resistance values, the same control signal is present at the respective control inputs of the individual semiconductor power switches if interference signals that have different effects on the control inputs of the semiconductor power switches are induced in the control line. The different resistance values each result in a different voltage drop at the compensation resistance elements. This enables the different interference signals at the control inputs to be reduced individually to a predeterminable level.

By each of the compensation resistance elements being connected between the control line and one of the control inputs, the MRT system may use an individual control line for setting all semiconductor power switches. This makes the manufacturing of the MRT system straightforward.

If one of the semiconductor power switches is provided as an individual electronic component (e.g., in a DIL housing), the compensation resistance elements may be connected directly in front of a connection of the component that leads to the control input of the semiconductor power switch (e.g., the gate). This enables the interference effects to be covered by the compensation.

Any free line section possibly remaining between the resistance element and the connection is short enough for no significant interference to be able to be induced by an interference field.

A suitable choice of resistance values is provided if, during operation of the MRT system with a predetermined control signal (e.g., with a typical, frequently-used control sequence), the current strengths of the part currents of the individual semiconductor power switches, which together form the described coil current, fulfill a specific condition. The condition involves the difference between the current strengths of the part currents being smaller than when the compensation resistance elements have the same resistance values. In other words, the individual semiconductor power switches, in the event of the individual semiconductor power switches being controlled with the control signal, conduct more similar currents. The part currents are thus balanced in current strength using the compensation resistance elements. The semiconductor power switches are more evenly loaded through this process so that the semiconductor power switches also age equally. A further advantage is that, with the MRT system, an asymmetry of the current strength does not provide that one of the semiconductor power switches always conducts a higher current than the remaining switches. This is why the electrical power conducted overall by the semiconductor power switches is to be limited upwards in order not to overload the one semiconductor power switch. In other words, with the described choice of resistance values, a greater power may be switched overall by the semiconductor power switches.

The suitable resistance values may be determined on the basis of one embodiment of a method. The method is thus suitable for manufacturing a circuit arrangement that is configured for switching a coil current of a magnetic coil of an MRT system. The circuit arrangement has a plurality of semiconductor power switches operable to be switched in parallel. Each semiconductor power switch of the plurality of semiconductor power switches receives a control signal at a control input that is transmitted from a control line to the control input via a compensation resistor. In accordance with the method, a prespecified curve of the control signal in the control line is created, and through this, the semiconductor power switches are switched into a conducting state so that each of the semiconductor power switches generates a part current. The part currents together produce the coil current. The part currents are compared with respect to current strength values. Instantaneous values or average timing values detected at the same time may be compared, or entire timing curves of the part current strengths may be compared. If it is established that the at least two part currents differ significantly (e.g., that more electrical power is being conducted to an undesirably high extent via one of the semiconductor power switches than via another), the resistance value of at least one of the compensation resistors is changed such that the current strength values are balanced out. The method may be carried out in a simulator (e.g., the part currents are simulated part currents). In one embodiment, the method may be carried out experimentally on a circuit prototype (e.g., the compensation resistors are replaced in an iterative method until such time as compensation resistances with suitable resistance values have been found). The experimental method may also build on a result of the simulation, with which approximately suitable resistance values have been determined for a given circuit design.

With such semiconductor switches, such a switch may include a transistor. As shown from the high-frequency equivalent circuit diagram of a transistor, there is a simple mathematical relationship between the resistance value of a compensation resistance element and a control voltage value acting effectively at the control input of the transistor (e.g., a base or gate). Thus, suitable resistance values may be determined simply. In one embodiment, a MOSFET or an insulated-gate bipolar transistor (IGBT) is used as the transistor. With this, the construction automatically produces an electrical separation between the control input, which is actually part of the control circuit of the MRT system, and the current paths for the part currents of the coil current, which are actually part of the power section and thus may have strong interference signal components.

The plurality of semiconductor power switches, which are connected upstream from a common magnetic coil, may be disposed on a common circuit board. The interference influences may thus be predicted by the layout of the circuit board. Accordingly, how the difference in the current strength of the individual part currents will pan out may be determined in the operation of the MRT system. For example, the interference influences are producible and thus may be compensated for by suitable selection of the resistance values.

DETAILED DESCRIPTION OF THE DRAWINGS

Figure 1:
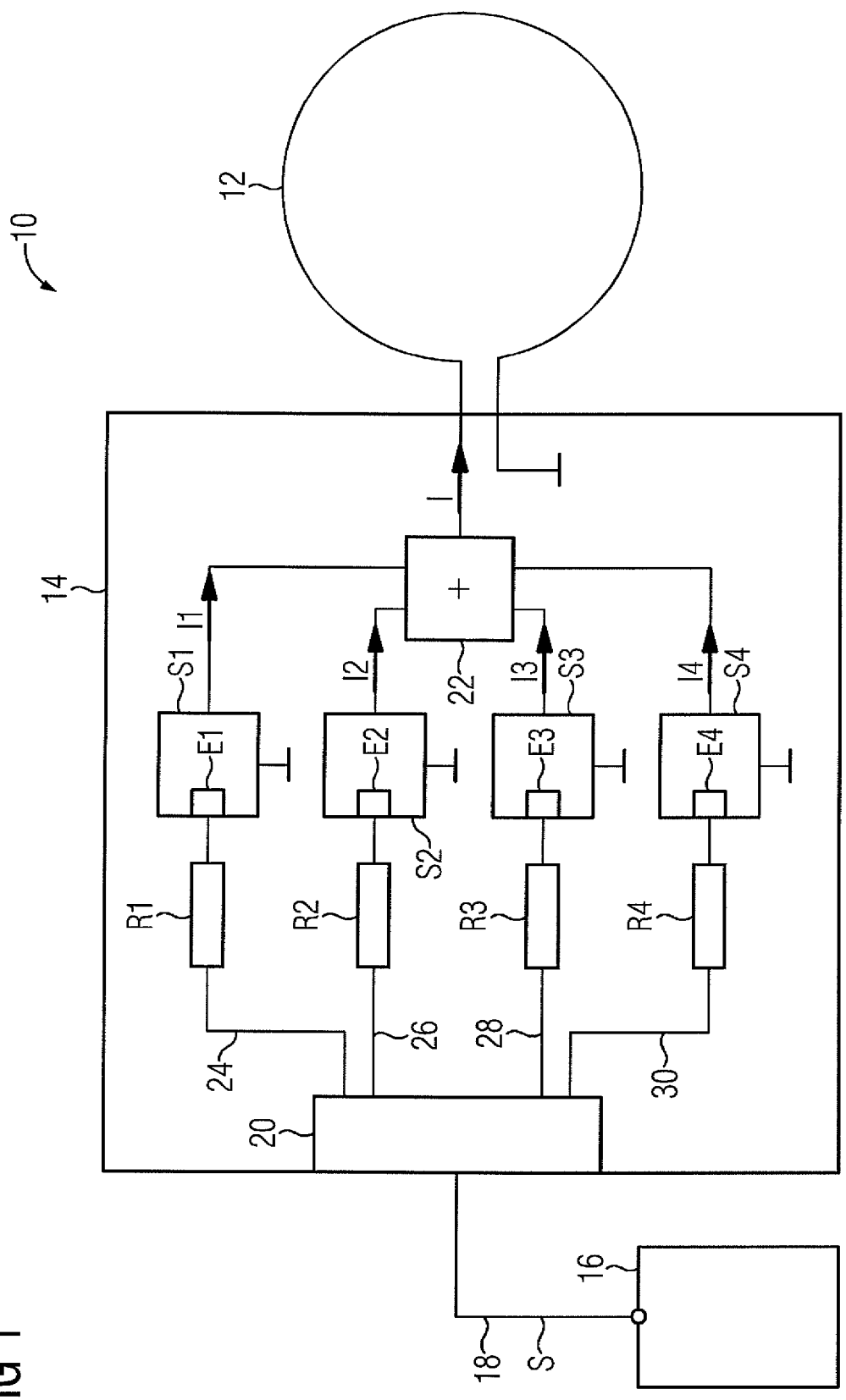
FIG. 1 shows a schematic diagram of an embodiment of a magnetic resonance tomography (MRT) system.

FIG. 1 shows one embodiment of a magnetic coil 12, a circuit arrangement 14 for switching a coil current I, and a control module 16 for generating a control signal S for the circuit arrangement 14 of a magnetic resonance tomography 10. By the control signal S, the control module 16 specifies a timing sequence, with which the coil current I is to flow through the magnetic coil 12. The magnetic coil 12 may, for example, involve a gradient coil or a body coil. The circuit arrangement 14 and the magnetic coil 12 are located in a magnetic basic field or a $B_0$ field of a helium-cooled magnetic coil (not shown) of the magnetic resonance tomograph 10.

To transmit the control signal S, the control module 16 is connected via a signal line 18 to an RF adaptation network 20 of the circuit arrangement 14.

The circuit arrangement 14 may, for example, involve a circuit board. To switch the coil current I, the circuit arrangement 14 in the example shown has four semiconductor power switches or switches S1, S2, S3, S4. The switches S1 to S4 may, for example, each include a MOSFET or an IGBT. A part current I1 to I4 is switched through the switches S1 to S4. The part currents I1 to I4 are combined in a usual manner in a circuit part 22 to form the coil current I.

The control signal S is supplied to the individual switches S1 to S4 from the adaptation network 20 via supply lines 24, 26, 28, 30 to respective control inputs E1, E2, E3, E4 of the switches S1 to S4. The respective connection pins, which form the control inputs E1 to E4, each have a compensation resistor R1, R2, R3, R4 connected upstream.

The compensation resistors R1 to R4 have different resistance values. During operation of the magnetic resonance tomograph 10, the part currents I1 to I4 still have similar-sized current strength values (e.g., the switches S1 to S4 supply the magnetic coil 12 with comparable electric power from a source (not shown)). For example, it does not occur that one of the switches S1 to S4 becomes overloaded while another switch still has a large power reserve. The magnetic coil 12 may thus be supplied with a comparatively large power by the circuit arrangement 14 without the risk arising that, as a result of an overload of the individual switch S1 to S4, an emergency disconnection is initiated. The measures for even distribution of the power to the switches S1 to S4 are very low-cost, so that the circuit arrangement 14 may also be provided at very low cost overall. The measures are explained in greater detail below in conjunction with FIG. 2.

Figure 2:
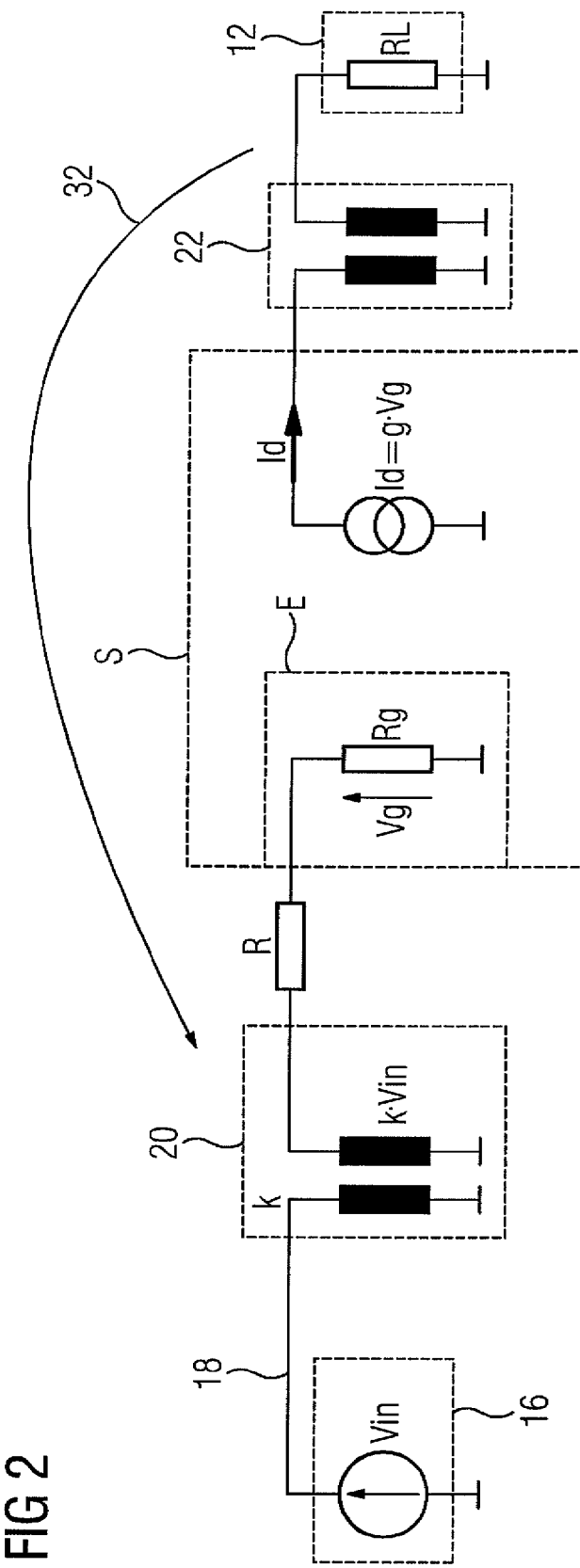
FIG. 2 shows an equivalent circuit diagram for an exemplary semiconductor power switch of the MRT system of FIG. 1.

In this connection, FIG. 2 shows a simplified equivalent transistor diagram of one of the switches S1 to S4 and of the components that are connected to the switch. Where appropriate, the elements in FIG. 2 are provided with the same reference characters as the corresponding elements in FIG. 1, where the sequence numbers 1 to 4 in each case for the four different switches are omitted (e.g., the reference character S may represent one of the switches S1 to S4).

In the equivalent circuit diagram, the control module 16 is represented by a voltage source with a source voltage Vin, and the adaptation network 20 is represented by a transformer with a transformation factor k. The compensation resistance is represented by an ohmic resistor R, and the control input E of the semiconductor power switch S is represented by an input or gate resistor Rg. A source-drain path of the switch S is represented by a current source with the source current Id, which is produced by a gain factor g of the switch S and the input voltage Vg, as falls at the input resistor Rg. The circuit part 22 forms an output transformer. The magnetic coil 12 forms a resistance load RL.

The output currents S1 to S4 (e.g., the part currents I1 to I4) cause magnetic and electromagnetic alternating fields, which effect the signal line 18, the adaptation network 20 and the supply lines 24 to 30 such that the signal voltage Vin or the converted signal voltage k*Vin is overlaid with an interference voltage that differs at each switch S1 to S4 because of the relative geometrical arrangement of the components to one another. In FIG. 2, this disruptive influence is shown symbolically as interference radiation 32. Since the relative location of the elements of the circuit arrangement 14 and of the magnetic coil 12 relative to the circuit arrangement 14 does not change, the influence of the interference radiation 32 on the individual switches S1 to S4 is always the same. Thus, the modification of the control signal S caused by the interference radiation 32 at the inputs E1 to E4 may be compensated for by a suitable choice of the resistance values of the compensation resistors R1 to S4. In this case, for the effective control voltage produced at the respective input E1 to E4 of the switch S1 to S4, the following mathematical relationship applies:

$$Vg=Rg/(R+Rg)*(k*Vin+Vs),$$

where Vs is the interference voltage induced by the interference radiation 32.

Overall, the examples show how, for a magnetic coil of an MRT system, a low-cost measure (e.g., providing suitable compensation resistors) may result in a greater electrical power being conducted through a circuit arrangement for switching the coil currents without individual semiconductor power switches of the circuit arrangement being overloaded.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography (MRT) system comprising:
   at least one magnetic coil for producing a magnetic resonance, a current strength of a coil current in the at least one magnetic coil being controllable by a plurality of semiconductor power switches as a function of a control signal,
   wherein the plurality of semiconductor power switches is operable to receive the control signal at a respective control input from a control line, and
   wherein in each of at least two semiconductor power switches of the plurality of semiconductor power switches, a compensation resistance element is connected between the control input and the control line, and resistance values of the compensation resistance elements are different.

2. The MRT system as claimed in claim 1, wherein at least one compensation resistance element is connected immediately in front of a terminal of an electronic component that an associated semiconductor power switch of the plurality of semiconductor power switches includes.

3. The MRT system as claimed in claim 2, wherein the resistance values are selected such that, during operation of the MRT system, for a prespecified curve of the control signal, current strengths of part currents, of which each flows through a semiconductor power switch of the plurality of semiconductor power switches and which together form the coil current, have a smaller difference than when the compensation resistance elements have the same resistance values.

4. The MRT system as claimed in claim 2, wherein at least one semiconductor power switch of the plurality of semiconductor power switches comprises a transistor.

5. The MRT system as claimed in claim 2, wherein the plurality of semiconductor power switches is disposed on a common circuit board.

6. The MRT system as claimed in claim 2, wherein to form the coil current to be provided overall in the at least one magnetic coil, the plurality of semiconductor power switches are connected to form a parallel circuit.

7. The MRT system as claimed in claim 1, wherein the resistance values are selected such that, during operation of the MRT system, for a prespecified curve of the control signal, current strengths of part currents, of which each flows through a semiconductor power switch of the plurality of semiconductor power switches and which together form the coil current, have a smaller difference than when the compensation resistance elements have the same resistance values.

8. The MRT system as claimed in claim 7, wherein at least one semiconductor power switch of the plurality of semiconductor power switches comprises a transistor.

9. The MRT system as claimed in claim 7, wherein the plurality of semiconductor power switches is disposed on a common circuit board.

10. The MRT system as claimed in claim 7, wherein to form the coil current to be provided overall in the at least one magnetic coil, the plurality of semiconductor power switches are connected to form a parallel circuit.

11. The MRT system as claimed in claim 1, wherein at least one semiconductor power switch of the plurality of semiconductor power switches comprises a transistor.

12. The MRT system as claimed in claim 11, wherein the transistor is a metal oxide semiconductor field-effect transistor (MOSFET) or an insulated-gate bipolar transistor (IGBT).

13. The MRT system as claimed in claim 11, wherein the plurality of semiconductor power switches is disposed on a common circuit board.

14. The MRT system as claimed in claim 11, wherein to form the coil current to be provided overall in the at least one magnetic coil, the plurality of semiconductor power switches are connected to form a parallel circuit.

15. The MRT system as claimed in claim 1, wherein the plurality of semiconductor power switches is disposed on a common circuit board.

16. The MRT system as claimed in claim 15, wherein to form the coil current to be provided overall in the at least one magnetic coil, the plurality of semiconductor power switches are connected to form a parallel circuit.

17. The MRT system as claimed in claim 1, wherein to form the coil current to be provided overall in the at least one magnetic coil, the plurality of semiconductor power switches are connected to form a parallel circuit.

18. A method for manufacturing a circuit arrangement configured for switching a coil current of a magnetic coil of a magnetic resonance tomography (MRT) system, wherein the circuit arrangement comprises a plurality of semiconductor power switches operable to switch the coil current of the magnetic coil, each semiconductor power switch of the plurality of semiconductor power switches being operable to switch a part current of the coil current as a function of a control signal that the respective semiconductor power switch receives at a control input via a compensation resistor from a control line, the method comprising:
   creating a pre-specified curve of the control signal and through the creating, generating the part currents;
   comparing current strength values of the part currents; and
   modifying a resistance value of at least one of the compensation resistors and through the modifying, balancing the current strength values,
   wherein after the modifying, resistance values of at least two of the compensation resistors are different.

* * * * *